United States Patent [19]

Casper

[11] Patent Number: 5,220,221
[45] Date of Patent: Jun. 15, 1993

[54] SENSE AMPLIFIER PULLDOWN CIRCUIT FOR MINIMIZING GROUND NOISE AT HIGH POWER SUPPLY VOLTAGES

[75] Inventor: Stephen L. Casper, Boise, Id.

[73] Assignee: Micron Technology, Inc., Boise, Id.

[21] Appl. No.: 847,630

[22] Filed: Mar. 6, 1992

[51] Int. Cl.$^5$ .......................... H03F 3/45; G06G 7/10
[52] U.S. Cl. .................................... 307/530; 307/491;
  307/542.1; 307/572; 307/263; 307/605;
  307/296.8
[58] Field of Search ...................... 365/205–207,
  365/189.06, 194, 296.1, 296.8; 300/542.1, 491,
  571–572, 443, 263, 601, 530, 605

[56] References Cited

U.S. PATENT DOCUMENTS

| | | | |
|---|---|---|---|
| 4,000,413 | 12/1976 | Wong et al. | 307/208 |
| 4,551,641 | 11/1985 | Pelley, III | 307/530 |
| 4,791,613 | 12/1988 | Hardee | 365/189 |
| 5,042,011 | 8/1991 | Casper et al. | 365/205 |
| 5,045,772 | 9/1991 | Nishiwaki et al. | 365/189.09 |
| 5,065,055 | 11/1991 | Reed | 307/530 |
| 5,138,201 | 8/1992 | Ohbayashi et al. | 307/530 |
| 5,140,199 | 8/1992 | Seo | 307/530 |

FOREIGN PATENT DOCUMENTS 62-145817 12/1988 Japan.

OTHER PUBLICATIONS

"A 4096-Bit High-Speed Emitter-Coupled Logic (ECL) Compatible Random Access Memory" Ebel et al., IEEE Journal of Solid-State Circuits, vol. SC10, No. 5, Oct. 1975.

*Primary Examiner*—Margaret R. Wambach
*Attorney, Agent, or Firm*—Michael W. Starkweather

[57] ABSTRACT

A pulldown circuit for a sense amplifier includes an output node for coupling to a common node of one or more sense amplifiers in a DRAM. The drain of an N-channel pulldown transistor is coupled to the output node. Additional pulldown circuitry includes an inverter, a P-channel transistor, and a bias circuit coupled to the supply voltage for providing a gate signal to the gate of the N-channel pulldown transistor. The slope of the gate signal is substantially insensitive to the value of the power supply voltage, thus changing the rate at which the common node is discharged to the enabling ground level. Since the rate of discharge is substantially the same at higher power supply voltages, the instantaneous current is substantially the same, which in turn prevents the internal ground lines from developing an additional undesirable ground voltage increase.

8 Claims, 2 Drawing Sheets

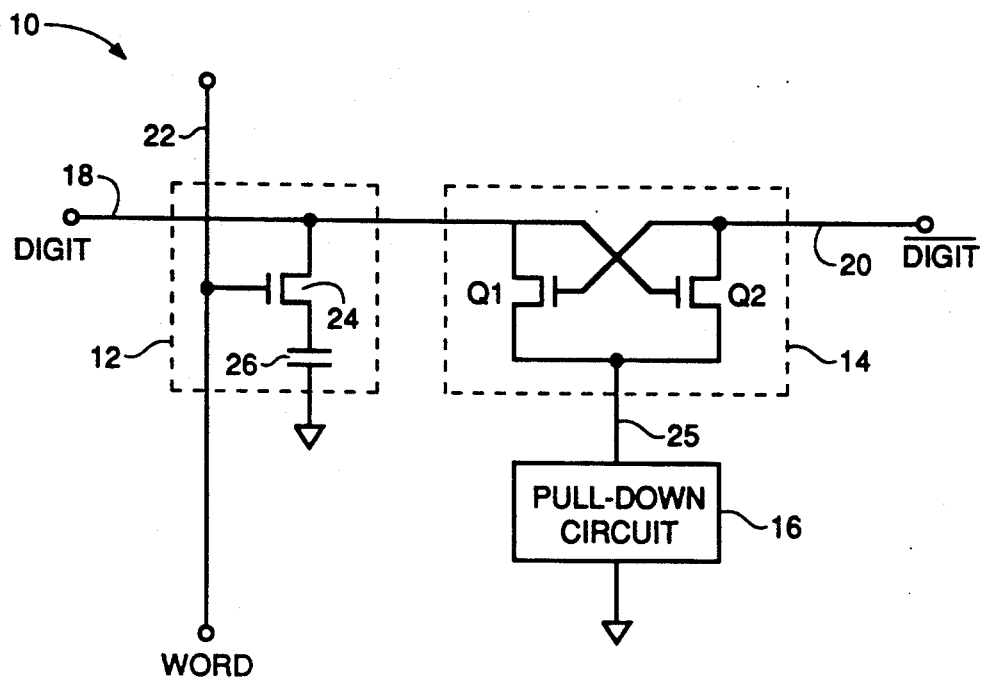
FIG. 1
(PRIOR ART)
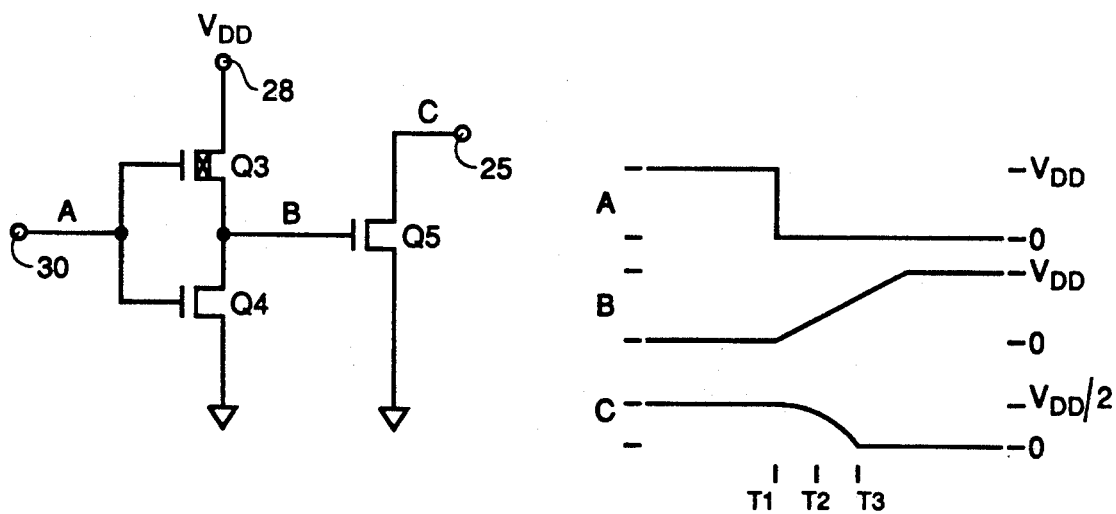
FIG. 2A
(PRIOR ART)
FIG. 2B
(PRIOR ART)

SENSE AMPLIFIER PULLDOWN CIRCUIT FOR MINIMIZING GROUND NOISE AT HIGH POWER SUPPLY VOLTAGES

BACKGROUND OF THE INVENTION

This invention relates generally to pulldown circuits for sense amplifiers in a dynamic random access memory ("DRAM"), and, more particularly, to a pulldown circuit that minimizes ground noise at high power supply voltages while maintaining normal operation at lower, normal power supply voltages.

A portion 10 of a basic DRAM configuration is shown in FIG. 1. One memory cell 12 from an array is coupled to a sense amplifier 14, which is controlled by a pulldown circuit 16. The memory cell includes an N-channel transistor 24 and storage capacitor 26. The gate of transistor 24 is coupled to a "word" line 22 and the drain of transistor 24 is coupled to a "digit" line 18. The word and digit lines are used to uniquely address other memory cells in the DRAM memory array. A complementary digit line 20 is either coupled to a reference voltage or senses complementary data to that stored in memory cell 12. The sense amplifier 14 includes a pair of N-channel sense amplifier transistors Q1 and Q2 having a cross-coupled gate and drain configuration that form the complementary digit lines 18 and 20. As is known in the art, transistors Q1 and Q2 sense the slight charge differential between the digit lines provided by the memory cells in the DRAM array. The positive feedback of the cross-coupled configuration amplifies the charge differential into full valid logic levels at digit lines 18 and 20. Several sense amplifiers 14 can be coupled to common node 25, each sense amplifier corresponding to a column of memory cells 12 in the DRAM memory array. The pulldown circuit 16 is typically an N-channel transistor in which the drain is coupled to node 25 and the source is coupled to ground. An input signal derived from an internal sense amplifier enable signal drives the gate of the transistor, which ultimately drives node 25 to ground, enabling the operation of sense amplifier 14.

A more sophisticated prior art sense amplifier pulldown circuit is taught in U.S. Pat. No. 5,042,011 ("'011") to Casper et al, entitled "Sense Amplifier Pulldown Device with Tailored Edge Input", which is hereby incorporated by reference. The pulldown circuit taught in the '011 U.S. Pat. No. minimizes noise on the digits lines 18 and 20 due to capacitive coupling through the sense amplifier 14 by tailoring the pulldown waveform characteristic.

A schematic diagram of the pulldown circuit is shown in FIG. 2A. In addition to a single N-channel pulldown transistor Q5, the pulldown circuit of FIG. 2A includes an inverter stage for controlling the rise time of the gate input signal "B", which in turn tailors the pulldown waveform "C" at node 25. The inverter stage includes a P-channel pullup transistor Q3 and an N-channel pulldown transistor Q4, wherein the ratio of the size of the pullup transistor Q3 to the size of the pulldown transistor is approximately 0.8. The gates of the transistors Q3 and Q4 are coupled together at node 30 to receive an inverter input signal "A", which is derived from the internal DRAM sense amp enable signal. The drains of transistors Q3 and Q4 are coupled together to form the inverting output. The source of transistor Q3 is coupled to a source of power supply voltage, VDD, at node 28. The power supply voltage has a typical nominal value of five volts. The source of transistor Q4 is coupled to ground.

In operation, the week pullup ability of transistor Q3 controls the rise time of the gate input signal B, which in turn controls the time at which pulldown transistor Q5 fully conducts. Referring now to FIG. 2B, the inverter input waveform A is shown as a negative-going step signal that initiates the action of the pulldown circuit at time T1. Subsequent to time T1, the gate input signal B begins to slowly rise with a rise time determined by the size of transistor Q3. Correspondingly, the pulldown waveform C begins to slowly fall from a previously equilibrated level of VDD/2. The initial movement of the pulldown waveform C is sufficient to enable the sense amp to begin charge sensing, but without an undesirable coupling of the pulldown waveform on to the digit lines 18 and 20. At time T2, once the digit lines begin to move slightly, the positive feedback renders the sense amplifier 14 fully operational and establishes full logic levels and digit lines 18 and 20. The full current provided by the sense amplifier 14 flows through pulldown transistor Q5, and thus common node 25 is quickly discharged to ground at time T3.

While the pulldown circuit shown in FIG. 2A represents an improvement beyond a sole pulldown transistor Q5, a problem remains when the power supply voltage VDD coupled to the DRAM is set to voltages above five volts. Typically, the VDD power supply can be set as high as six volts without causing damage to the DRAM. However, at these high power supply voltages, the internal ground lines in the DRAM can move as much as 0.5 volts during a CAS operation (column address strobe), when all the sense amplifiers 14 are activated. The amount of movement of the internal ground lines away from earth ground is related to the amount that the VDD power supply is above the nominal five volt level. The internal ground lines can have significant resistance, thus developing an associated voltage when the charge on the digit lines is quickly discharged through the sense amplifiers 14. The instantaneous current flowing into the parasitic internal ground resistance, which develops the ground voltage, is proportional to the VDD power supply voltage.

It is undesirable for the internal ground lines associated with the sense amplifiers to move away from zero volts because other DRAM circuitry may be referenced to that ground line. For example, if an input address buffer is referenced to an internal ground lines that moves to 0.5 volts during the CAS operation, data errors can result. Since the external source of read or write addresses is referenced to earth ground, a mismatch in logic levels can occur. The desired address for reading or writing data could be corrupted by the DRAM, resulting in data being written into or read from, an incorrect memory address. Other similar data errors are possible depending upon the particular DRAM architecture.

Accordingly, a need remains for a pulldown circuit for a sense amplifier in a DRAM that conditions the pulldown waveform in response to the VDD supply voltage in order to minimize internal ground line bounce or noise.

SUMMARY OF THE INVENTION

It is, therefore, an object of the invention to enable the sense amplifiers in a DRAM without generating noise on the internal ground lines.

Another object of the invention is to provide a novel pulldown circuit, wherein the pulldown waveform slope does not substantially change with an increase in the VDD power supply voltage.

A further object of the invention is to minimize data errors in a DRAM.

A still further object of the invention is to improve DRAM performance at high VDD power supply voltages.

According to the present invention, a pulldown circuit for a sense amplifier includes an output node for coupling to a common node of one or more sense amplifiers in a DRAM. The drain of an N-channel pulldown transistor is coupled to the output node. Additional pulldown circuitry includes an inverter, a P-channel transistor, and a bias circuit coupled to the supply voltage for providing a gate signal to the gate of the N-channel pulldown transistor. The slope of the gate signal is substantially insensitive to the value of the power supply voltage, thus maintaining the rate at which the common node is discharged to the enabling ground level. At the nominal power supply voltage, the common node is discharged at a first, relatively fast rate. At higher power supply voltages, the common node is discharge at a second, relatively slow rate that is a function of the power supply voltage. Since the rate of discharge of the common node is substantially the same at higher power supply voltages, the instantaneous current is substantially the same, which in turn prevents the internal ground lines from developing an additional undesirable ground voltage increase.

The foregoing and other objects, features and advantages of the invention will become more readily apparent from the following detailed description of a preferred embodiment of the invention which proceeds with reference to the accompanying drawings.

BRIEF DESCRIPTION OF THE DRAWINGS

FIG. 1 is a combined schematic and block diagram of a portion of a DRAM.

FIG. 2A is a schematic diagram of a prior art pulldown circuit.

FIG. 2B is a timing diagram for the pulldown circuit of FIG. 2A.

DETAILED DESCRIPTION

Figure 3:
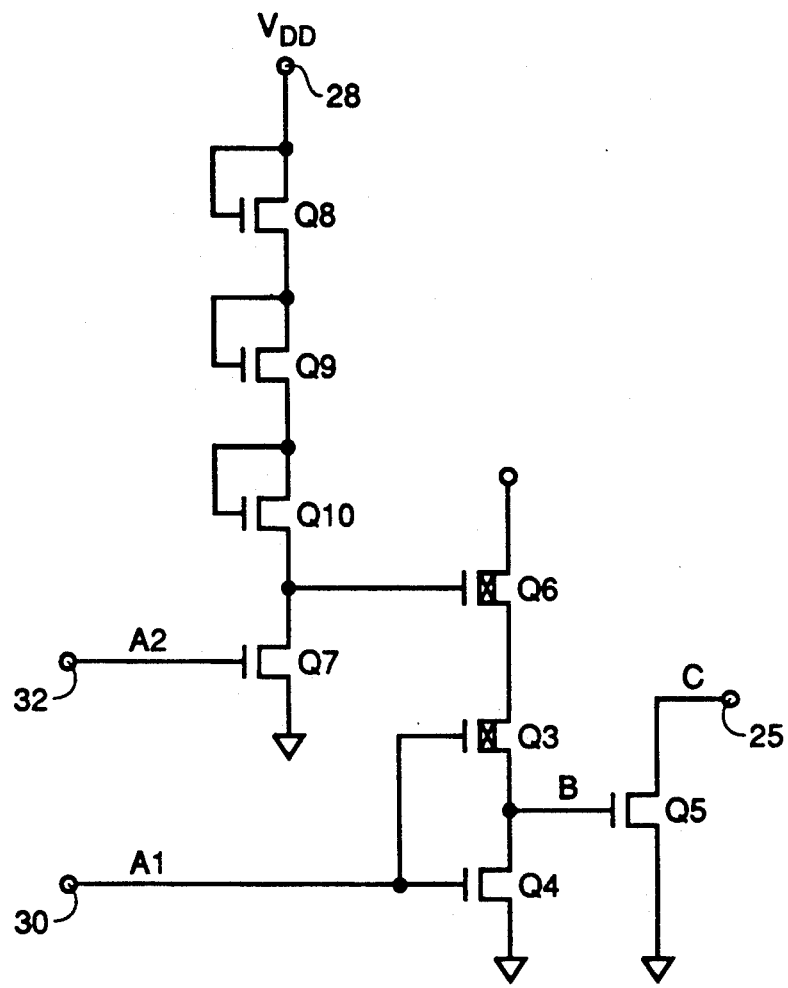
FIG. 3 is a schematic diagram of a pulldown circuit according to the present invention.

Referring now to FIG. 3, a pulldown circuit includes an N-channel pulldown transistor Q5, an inverter including P-channel transistor Q3 and N-channel transistor Q4, a P-channel pullup transistor Q6, and a bias circuit including diode-connected transistors Q8-Q10 and N-channel transistor Q7. The drain of pulldown transistor Q5 is coupled to the common node 25 and the source is coupled to ground. The coupled gates of inverter transistors Q3 and Q4 form a first input node 30 for receiving a negative-going input signal A1 derived from the internal sense amp enable signal. The coupled drains of transistors Q3 and Q4 form the inverting output for providing the gate signal B to the gate of transistor Q5. The source of transistor Q3 is the inverter power terminal, while the source of transistor Q4 is coupled to ground. P-channel transistor Q6 has a drain coupled to the power terminal of the inverter and a source coupled to the VDD power supply voltage at node 28. N-channel transistor Q7 has a drain coupled to the gate of P-channel transistor Q6, a gate forming a second input which is also derived from the internal sense amp enable signal. The source of transistor Q7 is coupled to ground. A voltage level shifter including diode-connected N-channel transistors Q8-Q10 has an input coupled to the VDD supply voltage at node 28, and an output coupled to the drain of transistor Q7. Three diode-connected transistors are shown, but a different number can be used depending upon threshold voltages, the nominal power supply voltage, and other factors.

In operation, the rise time of the gate signal B is inversely proportional to the value of the power supply voltage VDD in order to minimize internal ground line noise at higher supply voltages. The operation of the pulldown circuit of FIG. 3A is best understood with reference to the timing diagrams of FIG. 3B. The first and second input signals to the pulldown of FIG. 3 circuit are identified as A1 and A2. The first input signal A1 corresponds to the input signal A in FIG. 2A The second input signal A2 is a positive-going step function, which has standard CMOS levels of ground and VDD, typically five volts. The purpose of input signal A2 is to energize the bias circuit including N-channel transistor Q7 and diode-connected transistors Q8-Q10. It is desirable, but not essential, that input signal A2 be a step function. In the alternative, the gate of Q7 can be tied to a logic one level. Using the step function to turn on the bias circuit saves power since the bias circuit is only enabled during, and slightly prior to, enabling the sense amplifier 14. Once the bias circuit is activated by input signal A2, the gate potential of transistor Q6 is established. The gate potential of transistor Q6 is approximately equal to VDD-$3V_{TN}$, where $V_{TN}$ is the threshold voltage of the N-channel transistors Q8-Q10. Thus, the magnitude of the gate-to-source voltage of transistor Q6 is set to a substantially constant voltage of $3V_{TN}$ whenever VDD is greater than $3V_{TN}$. The current sourcing capability of transistor Q6 therefore remains substantially constant for the range of normal operating values of VDD above $3V_{TN}$.

Once the input signal A2 has switched logic states and the bias circuit has stabilized, input signal A1 is used to activate the inverter and the pulldown transistor Q5. The delay between signals A1 and A2 is determined by the time interval necessary to stabilize the bias circuit. At lower VDD voltages, such as four volts and assuming a typical threshold voltage $V_{TN}$ of about 1.5 volts, the circuit of FIG. 3 is essentially equivalent in structure and operation as the circuit shown in FIG. 2A. Since input signal A2 is at a logic high level, transistor Q7 is fully conducting, but since there is insufficient voltage across the load (transistors Q8-Q10) the drain of transistor Q7 is at ground. Since the gate of transistor Q6 is also at ground potential, it is fully conducting and the drain-to-source path of transistor Q6 is essentially a short circuit for analysis purposes. The operation of the circuit of FIG. 3 is therefore shown in the same timing diagram of FIG. 2B, input signal A being equivalent to input signal A1.

Figure 4:
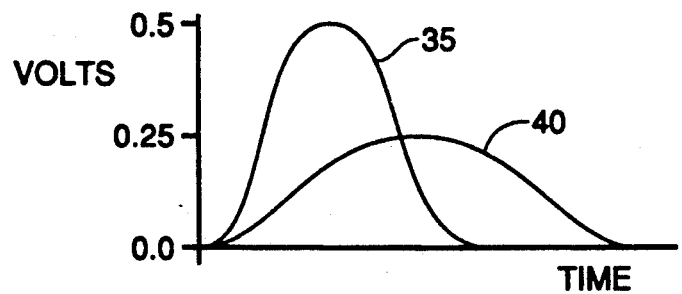
FIG. 4 is a timing diagram of compensated and uncompensated internal ground line voltage waveforms.

At higher VDD voltages such as six volts, the substantially constant magnitude of the gate-to-source voltage of transistor Q6 acts to limit the corresponding sourced current, which also flows through transistor Q3. The slope of the gate waveform B is thus held substantially constant by the action of the bias circuit. The operation at high VDD voltages is thus significantly different than that of the circuit shown in FIG. 2A. In the circuit of FIG. 2A, the current sourced by transistor Q3 is a direct function of VDD. As the power supply voltage is increased, the magnitude of the gate-to-source voltage of transistor Q3 is increased with a corresponding increase in drain current. Consequently, the slope of the gate waveform B is also increased. A longer time is therefore needed to fully discharge the digit line with the circuit of FIG. 3 than the prior art circuit of FIG. 2A. The uncompensated ground line movement waveform 35 corresponding to the prior art circuit of FIG. 2A and the compensated ground line movement waveform 40 corresponding to the circuit of FIG. 3 are shown in FIG. 4 at high VDD operation. Note that the ground line movement waveform 35 moves as much as 0.5 volts and discharges the digit line fairly quickly due to the higher instantaneous current. The ground line movement waveform 40 moves only 0.25 volts and discharges the digit line more slowly due to the lower instantaneous current, which is substantially equal to the current at nominal power supply voltage operation.

Although the pulldown circuit of FIG. 3 achieves a lower internal ground node voltage, the time interval for discharge the sense amplifiers is longer. While a seeming disadvantage, it is known to those skilled in the art that the time performance of DRAMs improves as the power supply voltage is increased. Therefore, there is additional time that can be used to improve the ground noise problem, while still meeting published time specifications. For example, a typical DRAM cycle time may be 100 nanoseconds at a supply voltage of 4.5 volts, while the same cycle time may decrease to 70 nanosecond at a supply voltage of six volts.

It has been shown that an apparatus and method for enabling a sense amplifier in a DRAM includes the step of reducing the initial, non-enabling value of the pulldown or common node of a sense amplifier to a final, enabling value in response to an enable command at a rate that is generally substantially insensitive to the value of the supply voltage in order to minimize internal ground line noise, as well as improve DRAM performance.

Having described and illustrated the principles of the invention in a preferred embodiment thereof, it is apparent to those skilled in the art that the invention can be modified in arrangement and detail without departing from such principles. For example, the type of memory cell or memory configuration is not important to the operation of the pulldown circuit, and therefore many variations of memory cells and array configurations can be used. Further, the exact rise time and bias voltages can be easily changed to accommodate different semiconductor processes or nominal power supply voltages which may be used. I therefore claim all modifications and variation coming within the spirit and scope of the following claims.

I claim:

1. A pulldown circuit for a sense amplifier that receives power from a source of supply voltage comprising:

an output node for coupling to a common node of a sense amplifier;

a pulldown transistor having a drain coupled to the output node, a gate, and a source coupled to ground;

an inverter having an input for receiving a first input signal, an output for providing a gate signal to the gate of the pulldown transistor, and a power terminal;

a first P-channel transistor having a drain coupled to the power terminal of the inverter, a gate for receiving a bias signal, and a source coupled to the source of supply voltage;

means for generating a bias signal, the value of the bias signal being a direct function of the supply voltage, such that the magnitude of the gate-to-source voltage of the P-channel transistor is substantially constant with respect to the value of the supply voltage; and the bias signal generating means having:

a first N-channel transistor having a drain for providing the bias signal, a gate for receiving a second input signal, and a source coupled to ground; and a voltage level shifter having an input coupled to the source of supply and an output coupled to the drain of the first N-channel transistor.

2. A pulldown circuit as in claim 1 in which the first input signal is a negative-going step function and the second input signal is a positive-going step function.

3. A pulldown circuit as in claim 1 in which the voltage level shifter comprises a plurality of diode-connected N-channel transistors connected in series.

4. A pulldown circuit as in claim 1 in which the inverter comprises a second P-channel transistor and a second N-channel transistor having coupled gates forming the input and coupled drains forming the output.

5. A sense amplifier and pulldown circuit comprising:

a pair of N-channel sense amplifier transistors having a cross-coupled gate and drain configuration forming complementary digit lines for sensing charge in a memory array, and coupled sources forming a common node;

an N-channel pulldown transistor having a drain coupled to the common node, a gate, and a source coupled to ground;

an inverter having an input for receiving a negative-going sense amp enable signal, an output for providing the gate signal, and a power terminal;

a first P-channel transistor having a drain coupled to the power terminal of the inverter, a gate, and a souce coupled to a source of supply voltage;

a first N-channel transistor having a drain coupled to the gate of the first P-channel transistor, a gate for receiving a second positive-going sense amp enable signal, and a source coupled to ground; and a voltage level shifter having an input coupled to the source of supply voltage and an output coupled to the drain of the first N-channel transistor.

6. A sense amplifier and pulldown circuit as in claim 5 in which the first negative-going sense amp enable signal is delayed relative to the second positive-going sense amp enable signal.

7. A pulldown circuit as in claim 5 in which the voltage level shifter comprises a plurality of diode-connected N-channel transistors connected in series.

8. A pulldown circuit as in claim 5 in which the voltage level shifter comprises three diode-connected N-channel transistors connected in series.

* * * * *